(12) United States Patent
Kim et al.

(10) Patent No.: US 6,661,272 B2
(45) Date of Patent: Dec. 9, 2003

(54) DIGITALLY CONTROLLABLE INTERNAL CLOCK GENERATING CIRCUIT OF SEMICONDUCTOR MEMORY DEVICE AND METHOD FOR SAME

(76) Inventors: Nam-Seog Kim, 29/3, 101, #212, Jangwi 1-dong, Sungbuk-gu, Seoul 136-141 (KR); Yong-Jin Yoon, 102-273, Hwagok-dong, Kangseo-gu, Seoul 157-010 (KR)

(*) Notice: Subject to any disclaimer, the term of this patent is extended or adjusted under 35 U.S.C. 154(b) by 0 days.

(21) Appl. No.: 10/041,060

(22) Filed: Jan. 7, 2002

(65) Prior Publication Data

US 2003/0067338 A1 Apr. 10, 2003

(30) Foreign Application Priority Data

Oct. 6, 2001 (KR) ......................................... 2001-61579

(51) Int. Cl.[7] .................................................. H03K 3/00
(52) U.S. Cl. ....................................... 327/291; 327/294
(58) Field of Search ................................ 327/291, 294, 327/293, 299, 270, 271, 276, 277, 512, 513; 310/315; 331/176

(56) References Cited

U.S. PATENT DOCUMENTS

| | | | | |
|---|---|---|---|---|
| 5,128,555 A | * | 7/1992 | Millman | 326/88 |
| 5,327,392 A | * | 7/1994 | Ohtsuka et al. | 365/233 |
| 5,847,617 A | * | 12/1998 | Reddy et al. | 331/57 |
| 5,896,045 A | * | 4/1999 | Siegel et al. | 326/81 |
| 6,104,228 A | * | 8/2000 | Lakshmikumar | 327/407 |
| 6,204,710 B1 | * | 3/2001 | Goetting et al. | 327/276 |
| 6,223,248 B1 | * | 4/2001 | Bosshart | 711/105 |
| 6,229,358 B1 | * | 5/2001 | Boerstler et al. | 327/116 |
| 6,347,394 B1 | * | 2/2002 | Ochoa et al. | 716/6 |

* cited by examiner

Primary Examiner—Timothy P. Callahan
Assistant Examiner—Linh Nguyen
(74) Attorney, Agent, or Firm—F. Chau & Associates, LLP

(57) ABSTRACT

An internal clock generating circuit of a semiconductor device includes: a delay chain having a plurality of delay units for generating multi-phase clocks by adjusting an input clock; a thermometer for outputting a thermometer code value in response to an input selection data; a multiplexer for selectively outputting one of a plurality of clocks input from the delay chain in response to the thermometer code value of the thermometer; and a pulse regenerator for outputting an adjusted internal clock by restoring a pulse form of the clock output from the multiplexer into its original state and controlling the delay thereof as much as desired.

17 Claims, 9 Drawing Sheets

DIGITALLY CONTROLLABLE INTERNAL CLOCK GENERATING CIRCUIT OF SEMICONDUCTOR MEMORY DEVICE AND METHOD FOR SAME

BACKGROUND OF THE INVENTION

1. Field of the Invention

The present invention relates to a clock processing part and more particularly to an internal clock generating circuit and a method for the same.

2. Description of the Related Art

Typically, a central processing unit (CPU) and a semiconductor memory device are interconnected through a signal bus. In such a case, the CPU and the semiconductor memory device function as master and slave, respectively. The CPU master transmits data including address, command, writing data, and a clock required for sampling data to the memory device slave.

An external clock transmitted through the signal bus may be a clock aligned or centered to the data as shown in FIGS. 1 and 2. The slave memory receives the external clock and generates an internal clock needed for sampling data. In order to correctly sample data, the internal clock should be a data-centered clock as shown in FIG. 1b. If an external clock is a data-aligned clock, it is relatively difficult to generate a data centered internal clock. However, a gradual increase in the data rate/pin decreases the number of valid data windows. If the data and clock have slightly different paths in the system, there may be a bigger skew between the clock and pin that will be applied to the slave. The problem gets worse in a double data rate (DDR) product, which receives two pieces of data at one clock cycle as shown in FIG. 2b, compared to a single data rate (SDR) product as shown in FIG. 2a.

When an external clock is centered or aligned to data, a system designer desires to adopt to the slave a function of intentionally pushing or pulling the timing of a clock on a time axis as shown in FIG. 3 in order to use an internal clock adjusted to a valid window of data. At this time, the slave memory performs a setup/hold centering function of a data sampling clock by pushing or pulling the timing of a clock on the time axis in response to a setting signal.

Typically, a delay line or delay chain is constructed with an inverter chain having a plurality of inverters as internal delay elements. The inverter chain is constructed with inverters connected in at least more than two levels having a relatively large amount of a unit delay. Therefore, it is not adequate to a case that requires a more precise delay.

What is needed is a delay line or delay chain providing improved resolution degree by decreasing the amount of unit time delay and providing more precise control of the delay while minimizing skew in the clock signal.

SUMMARY OF THE INVENTION

Therefore, the present invention is disclosed to solve the aforementioned problems and it is an object of the invention to provide an internal clock generating circuit to generate an internal clock precisely controlled as much as the necessary amount of delay in an improved resolution degree and a method for the same.

It is another object of the present invention to provide an internal clock generating method and the related circuit that can precisely sample data even when there is a skew between clock and data to be applied to a semiconductor memory.

It is a still another object of the present invention to provide an internal clock generating method and the related circuit that can control the delay time in response to an external signal.

It is a further another object of the present invention to provide an internal clock generating method and the related circuit that can minimize skew of an output clock, but in an improved resolution degree.

In order to accomplish the aforementioned objects in accordance with an aspect of the present invention, disclosed is an internal clock generating circuit of a semiconductor device comprising a delay chain having a plurality of delay units for generating multi-phase clocks by adjusting an input clock, a thermometer converter for outputting a thermometer code value in response to an input selection data, and a multiplexer for selectively outputting one of a plurality of clocks input from the delay chain in response to the thermometer code value.

In another aspect of the invention the multiplexer selectively outputs one of the plurality of clocks applied from the delay chain by dividedly multiplexing the thermometer code value into two stages of upper and lower bits.

In another aspect of the invention the delay chain additionally includes regenerators to restore a pulse form of a clock.

In another aspect of the invention the delay unit of the delay chain is constructed with RC delays.

In another aspect of the invention the regenerator is a short type pulse generator.

In another aspect of the invention a pulse regenerator is additionally included to restore a pulse form of a clock output from the multiplexer.

In another aspect of the invention the pulse regenerator is a short type pulse regenerator.

In another aspect of the invention the regenerators are respectively positioned in symmetry at positions where +/− delay of the delay units against the thermometer code value changes non-linearly.

In another aspect of the invention the selection data is a binary code data applied from outside.

In another aspect of the invention the delay unit of the delay chain is constructed with path gates.

Disclosed is a method of generating clock signals in a semiconductor device comprising the steps of generating multi-phase clock signals by adjusting an input clock signal through a delay chain having a plurality of delay units, decoding a thermometer code value in accordance with selection data, outputting one of the plurality of clock signals in response to the thermometer code value, and restoring a pulse shape of the output clock signal into its original state and outputting it as a delay-controlled internal clock signal.

Disclosed is a semiconductor clock signal circuit, comprising means for generating multi-phase clock signals by adjusting an input clock signal through a delay chain having a plurality of delay units, means for decoding a thermometer code value in accordance with selection data, means for outputting one of the plurality of clock signals in response to the thermometer code value, and means for restoring a pulse shape of the output clock signal into its original state and outputting it as a delay-controlled internal clock signal.

DETAILED DESCRIPTION OF PREFERRED EMBODIMENTS

Figure 1A:
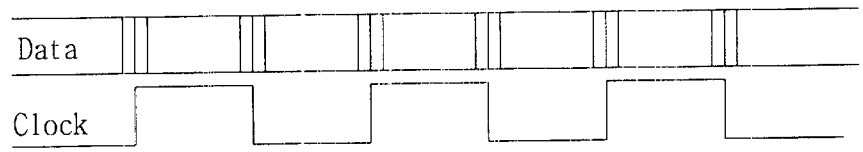
FIGS. 1 through 3 show clock and data signals of the prior art.
Figure 1B:
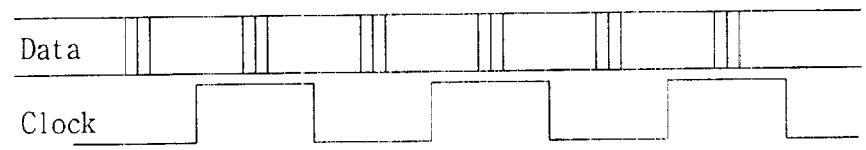
Figure 2A:
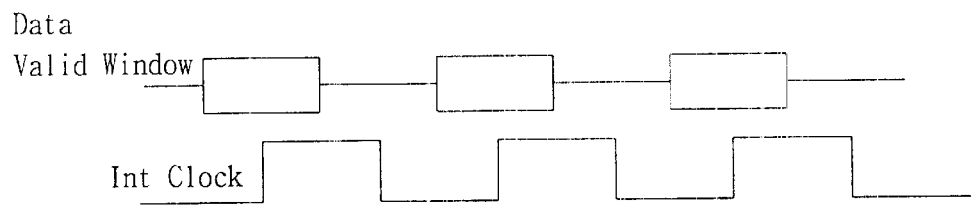
Figure 2B:
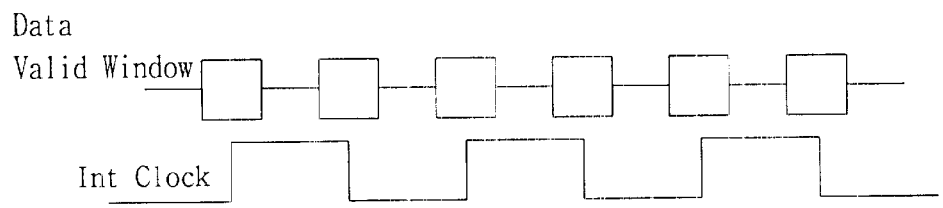

Other objects and aspects of the invention will become apparent from the following description of preferred embodiments with reference to accompanying drawings. Like reference numerals and nomenclature (symbols) are used for designation of like or equivalent parts or portions for simplicity of illustration and explanation, the detailed descriptions of which will be omitted.

Figure 3:
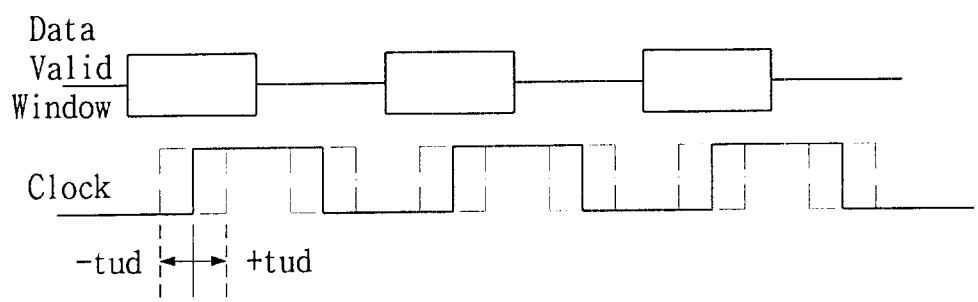

As shown in FIG. 3, when a function of intentionally pushing or pulling the timing of a clock signal is applied to a slave, an externally set digital signal is applied to the slave as a timing control signal. In other words, the digital signal is an input signal to the slave to indicate how much time is pushed or pulled prior to a normal operation of the slave. In the present invention, by externally setting the digital signal, the slave can perform the setup/hold centering function of the data sampling clock according to the set digital signal. Accordingly, a clock processing unit of the slave performs the setup/hold centering function by making a +/− time delay relevant to an externally input digital signal, for instance, the digital code value.

Figure 4:
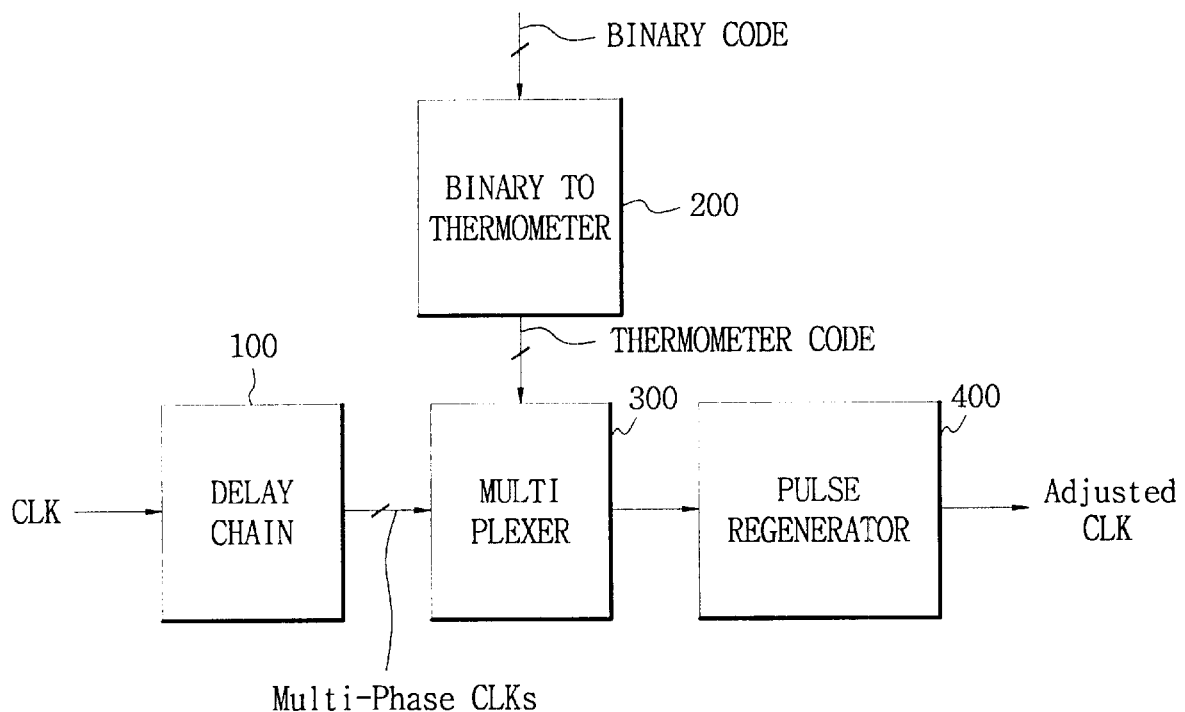
FIG. 4 is a block diagram of the invention.

FIG. 4 is a block diagram in accordance with an embodiment of the present invention, including a delay chain 100, a binary-to-thermometer converter 200, a multiplexer 300, and a pulse regenerator 400. The delay chain 100 is constructed with a plurality of delay groups, each of which is made of a plurality of delay units, to generate a plurality of multi-phase clocks by adjusting input clocks that are being received through a clock receiver. The binary-to-thermometer converter 200 outputs a thermometer code in response to selection data, for instance, a binary code. The multiplexer unit 300 selectively outputs one of the plurality of clocks applied from the delay chain 100 in response to the thermometer code. The pulse regenerator 400 restores a pulse form of a clock output from the multiplexer 300 into its original state and outputs an internal clock that is delay-controlled as desired.

Figure 5:
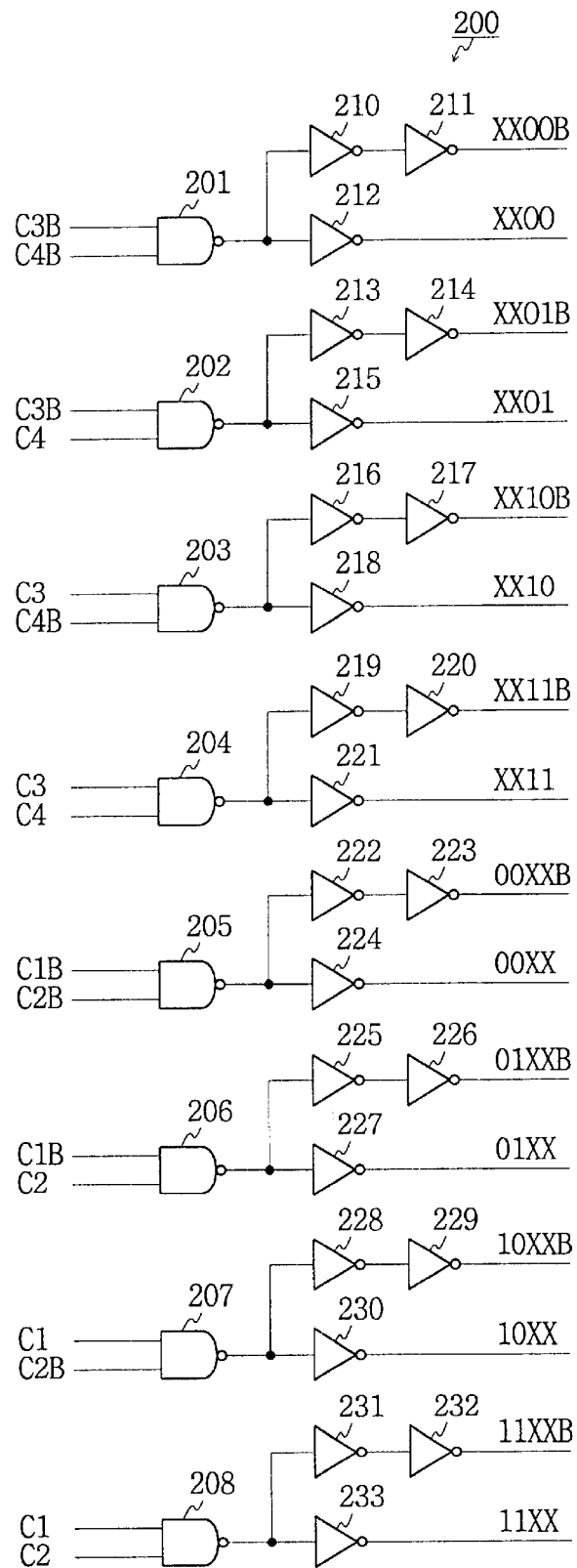
FIG. 5 is a circuit diagram of a binary-to-thermometer converter.

FIG. 5 is a perspective circuit view for illustrating the thermometer converter 200 in FIG. 4. In the drawing, a plurality of NAND gates 201–208 are elements for NAND gating center data applied through their respective input terminals. Inverters 210–233 are respectively connected in correspondence with output terminals of the NAND gates 201–208 for inverting the logic level of the input terminals. At this time, the selection data C1, C4, C1B, and C4B are MSB (most significant bit), LSB (least significant bit), complementary signal of C1 and complementary signal of C4. In FIG. 5, X symbolizes a signal of an output terminal indicating a "don't care" state. For instance, when C3B, C4B are respectively received with the logic level of "0",an output of the NAND gate 201 is 1. The outputs of the inverters 212, 211 are respectively XX00, XX00B.

Figure 6:
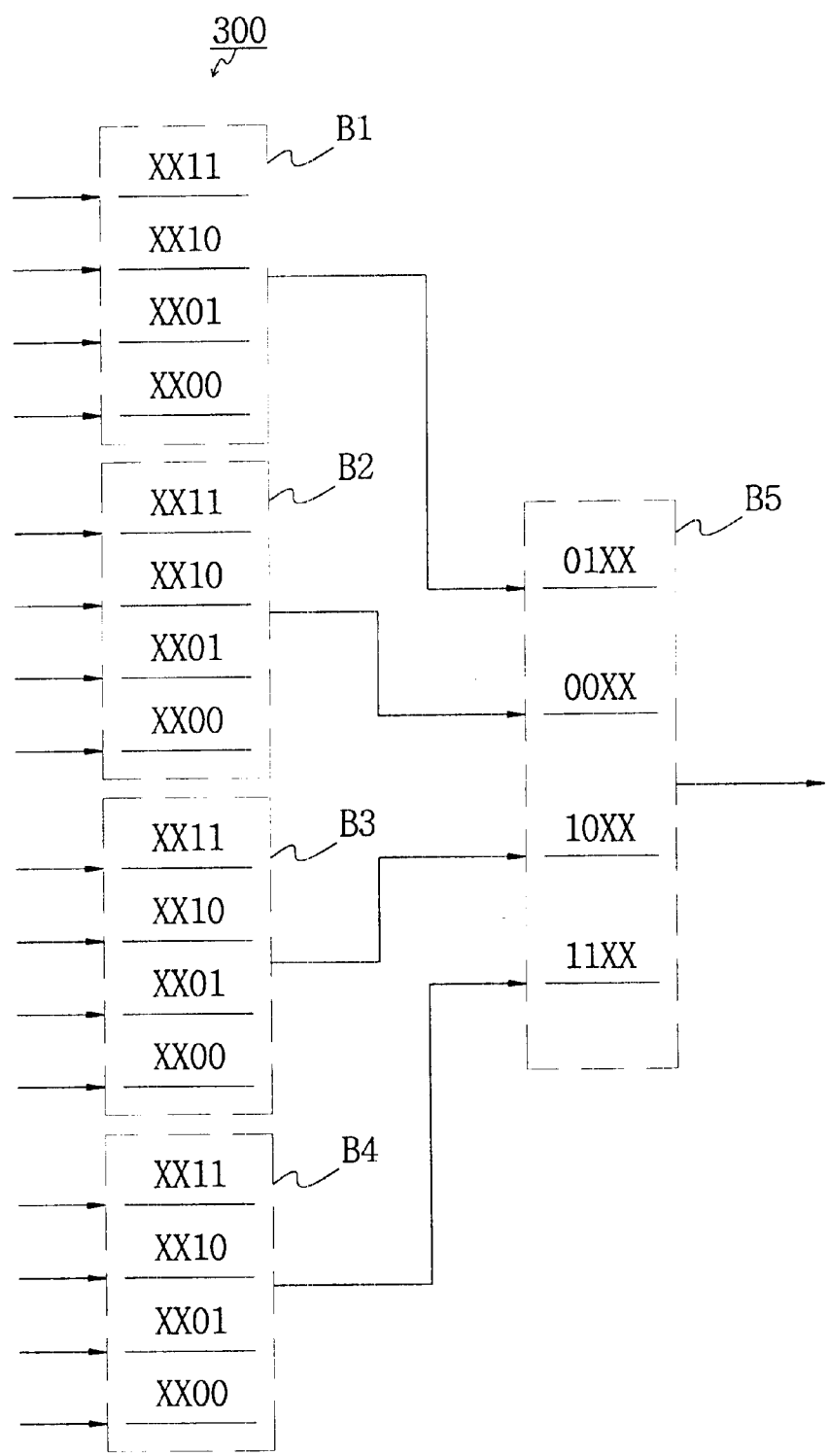
FIG. 6 is a circuit diagram of a multiplexer.

FIG. 6 is a perspective function block view for illustrating the multiplexer 300 shown in FIG. 4. In other words, as shown in FIG. 6, a thermometer code generated in FIG. 5 is input and multiplexed at two steps to select one of multiphase clocks adjusted in the delay chain 100. A first group of multiplexers B1, B2, B3, B4 uses the lower two bits of the selection data to select one of the 4 clocks at each delay group of the delay chain 100. A second group of multiplexer B5 uses the upper two bits of the selection data to select one of the four output clocks selected by the lower two bits, thereby letting one desired clock selectively output.

Figure 7:
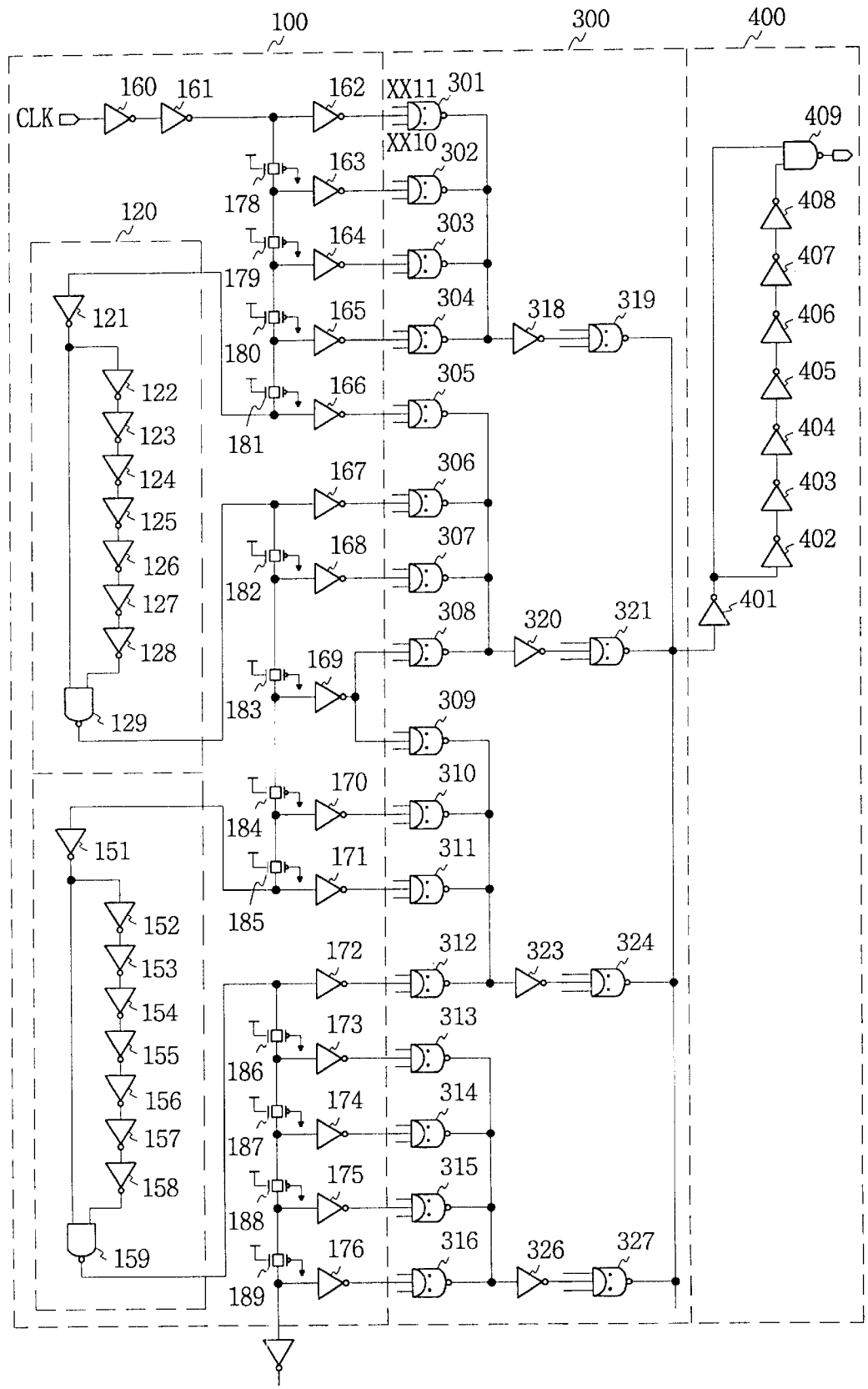
FIG. 7 is a circuit diagram of the invention.

FIG. 7 is a circuit view for specifically illustrating the block diagram of FIG. 4, specifically the delay chain 100, multiplexer 300 and pulse regenerator 400. The delay chain 100 is constructed with path gates 178–189 to provide precise control. Also, delay chain pulse regenerators 120 are respectively connected between the pulse gates 181, 182 and the path gates 185, 186. These pulse regenerators 120 are constructed with inverters 121–128 and a NAND gate 129. An input clock is received through a reception terminal of the inverter 160 of the delay chain 100. The input clock is sequentially delayed as much as a delay unit of those path gates 178–179 after passing through inverters 160, 161. The pulse regenerators 120 are connected every four path gates, being installed in vertical symmetry in the drawing. Therefore, the wave form skewed while passing through path gates is formulated into its initial wave form by operations to be described below. At this time, the regenerator 120 functions as a short pulse generator. Multiplexer 300 includes a plurality of clocked CMOS inverters 301–316, 319, 321, 324, 327 and inverters 318, 320, 323, 326. Clock control terminals of the clocked CMOS inverters 301–316, 319, 321, 324, 327 are respectively connected with inputs of the thermometer 200 to receive thermometer codes. The pulse regenerator 400 is constructed with inverters 401–408 and a NAND gate to perform in the same manner as the delay chain pulse regenerators 120 and serves to restore the waveform of the outputting clock pulses.

Figure 8A:
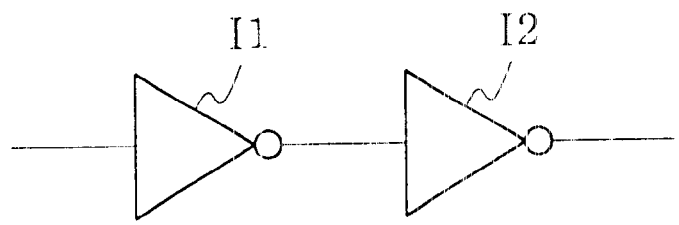
FIGS. 8a through 8c show delay units and output characteristics thereof.
Figure 8B:
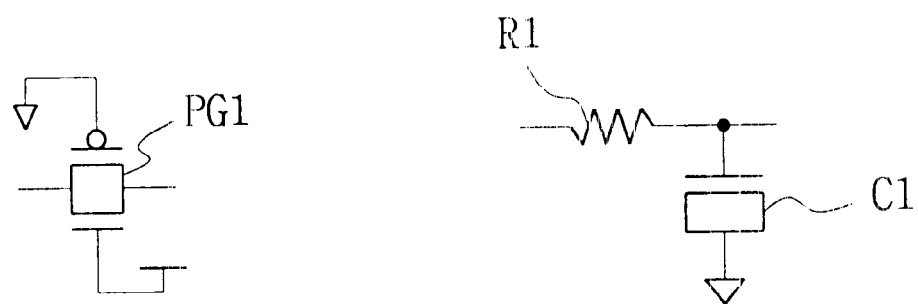
Figure 8C:
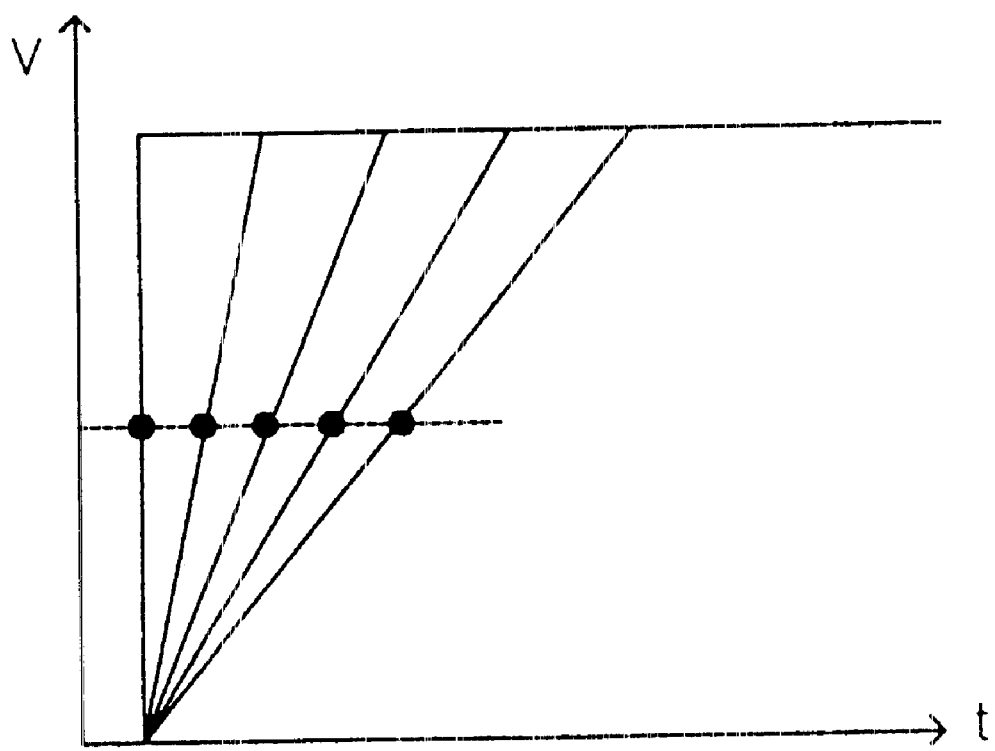
Figure 9A:
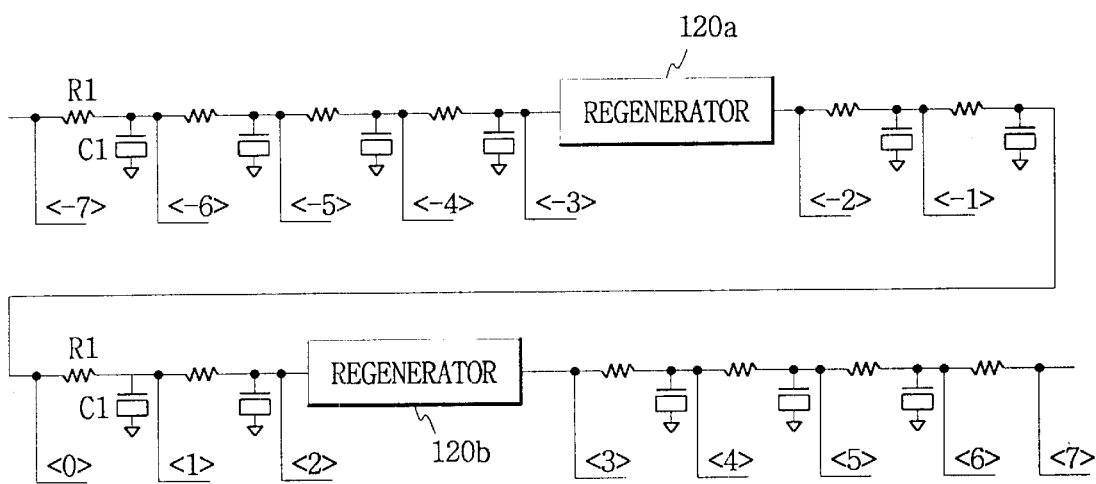
FIGS. 9a and 9b show delay chains.
Figure 9B:
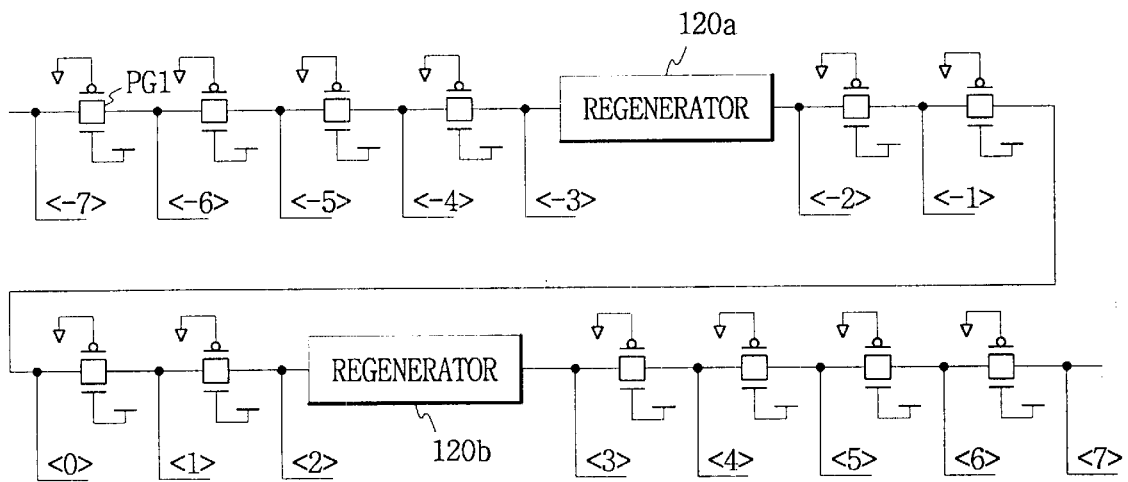

FIGS. 8a, 8b and 8c show delay units and output characteristics of the delay clocks thereof. A general digital delay circuit can be simply constructed into two stages of inverters 11, 12 as shown in FIG. 8a. However, the amount of time delayed by the two stages of inverters 11, 12 is quite big, so that it is not adequate when a precise control of delay is required. In order to cope with the case as such, it is made possible in the present invention to make a further more precise control of delay. The path gate delay PG1 is constructed in combination of P-type and N-type MOS transistors, and the RC delay is constructed with resistor R1 and MOS capacitor C1. If the delay units are utilized to increase the number of delay stages as shown in FIG. 8c, there is an increase in the rising and falling time of the delayed and output signal, thereby resulting in skew of a clock signal. Therefore, it is preferable that regenerators 120a, 120b are connected to restore the form of clock pulses into their original ones whenever they pass through a predetermined number of delay stages as shown in FIGS. 9a and 9b. The regenerators 120a, 120b shown in FIGS. 9a, 9b are constructed with inverters 121–128, NAND gate 129 as shown in FIG. 7.

With reference to FIG. 7, operations of the regenerator 120 will be described. Whenever a clock pulse passes through the delay units, the waveform of the clock pulse is further skewed. In order to correct the skewed waveform back into it's original form, the delay chain regenerators 120 function as a short pulse generator. An inverter 121 receives and inverts the clock pulse that has passed and delayed through the path gate 181 to supply it to an input of the NAND gate 129 and that of the inverter 122. The clock pulse output from the inverter 121 is repeatedly inverted by a plurality of inverters 123–128 connected in series at the rear end of the inverter 122 and output from the inverter 128. The clock pulse output from the inverter 128 is inverted and delayed by an odd number of inverters 122–128. For instance, the clock pulse output from the inverter 121 is a high pulse, the clock pulse output from the inverter 128 is a low pulse. As a result, the NAND gate 129 outputs a low pulse only in an interval where the output pulses of the inverters 121, 128 are simultaneously high. The low pulse output at this time is the one that has been formulated by a function of the NAND gate 129. The output of the NAND gate 129 is applied to an inverter 167 and path gate 182 of the following delay group. Thus, the inverter 167 and path gate 182 receives not a skewed clock pulse, but a clock pulse whose wave form has been restored into its original state.

FIG. 9*a* illustrates a structure in which a plurality of RC delay units are connected in series with regenerators at every four RC delay units. On the other hand, FIG. 9*b* illustrates a structure in which a plurality of path gates are connected in series with regenerators at every four path gates.

Figure 10:
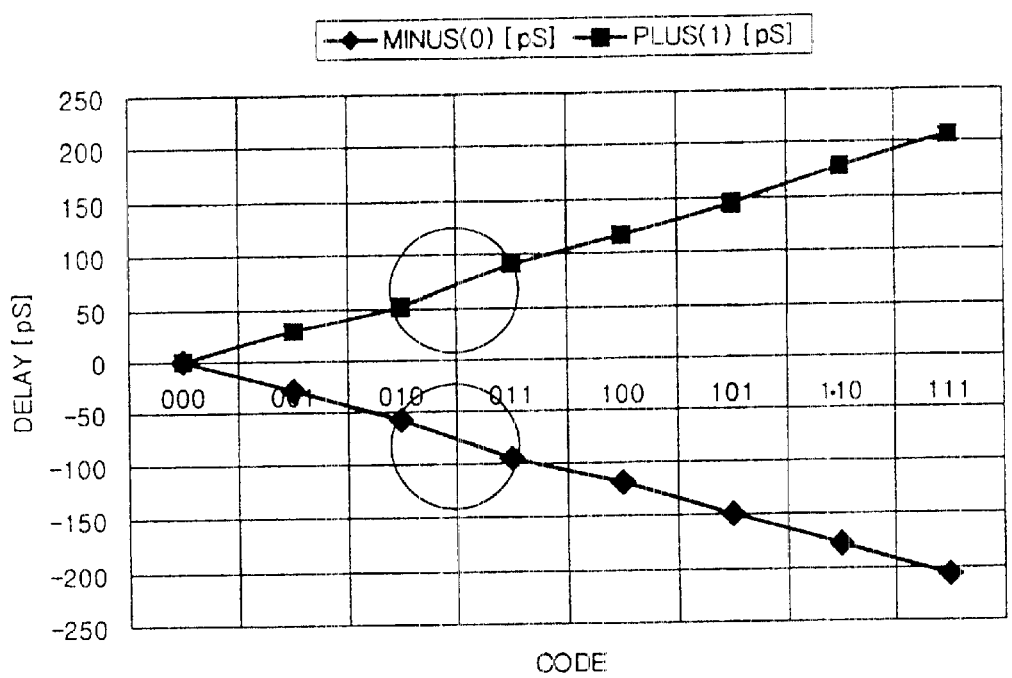
FIG. 10 shows the delay characteristics of the invention.

FIG. 10 is a graph that illustrates delay characteristics of codes in accordance with the present invention. In FIG. 10, the horizontal and vertical axes respectively indicate thermometer code values and the amount of time delay. At this time, a slightly non-linear delay is shown between codes 010 and 011 as it has been made by delay of the delay chain regenerators 120*a*, 120*b*. Therefore, the delay chain regenerators are installed in symmetry as shown in FIG. 7.

In the embodiment of the present invention, as shown in FIGS. 9*a* and 9*b*, regenerators are installed at every plurality of delay stages and, as shown in FIG. 7, in symmetry at every four pass gates on the sides of the +/− delays, thereby performing a delay control with minimal skew.

The overall operations will be described below with reference to FIG. 4. The delay units of the delay chain 100 generate a plurality of clocks having a predetermined amount of time delay against an input clock and supply them to the multiplexer 300. Then, the multiplexer 300 selects one of the clocks in response to the thermometer code and applies it to the pulse regenerator 400. The pulse regenerator 400 restores a pulse of the applied clock and outputs the time delay controlled (adjusted) internal clock as a data sampling clock. At last, in order to make an accurate centering of the internal clock for sampling data to a valid data window, the internally generated or received clock is pushed or pulled according to an external digital code signal to make into a digitally controlled internal clock. At this time, the digital signal is utilized because it is easier to artificially push or pull the data sampling clock as much as several digital time steps (total +/− tud) than an analog signal. Therefore, in other cases, an analog signal can be used as a control signal.

While the invention has been described in terms of a preferred embodiment, those skilled in the art will recognize that the invention can be practiced with modification within the spirit and scope of the appended claims. For instance, in other cases, the delay elements may be replaced with equivalent circuit elements or other logic elements.

As described above, there are advantages of providing an improved resolution and minimizing skew of an output clock in the present invention. Another advantage of the invention is that data can be accurately sampled by utilizing an internal clock even if there is a skew between the clock and data applied to memory.

What is claimed is:

1. An internal clock generating circuit of a semiconductor device comprising:

a delay chain having a plurality of delay units for generating multi-phase clocks by adjusting an input clock;

a thermometer converter for outputting a thermometer code value in response to an input selection data; and a multiplexer for selectively outputting one of a plurality of clocks input from the delay chain in response to the thermometer code value, wherein the multiplexer selectively outputs one of the plurality of clocks applied from the delay chain by dividedly multiplexing the thermometer code value into two stages of upper and lower bits.

2. The circuit of claim 1, wherein the delay chain additionally includes regenerators to restore a pulse form of a clock.

3. The circuit of claim 2, wherein the delay unit of the delay chain is constructed with RC delays.

4. The circuit of claim 2, wherein at least one of the regenerators is a short type pulse generator.

5. The circuit of claim 1, wherein a pulse regenerator is additionally included to restore a pulse form of a clock output from the multiplexer.

6. The circuit of claim 5, wherein the pulse regenerator is a short type pulse regenerator.

7. The circuit of claim 2, wherein the regenerators are respectively positioned in symmetry at positions where +/− delay of the delay units against the thermometer code value changes non-linearly.

8. The circuit of claim 1, wherein the selection data is a binary code data applied from outside.

9. The circuit of claim 2, wherein the delay unit of the delay chain is constructed with path gates.

10. A method of generating clock signals in a semiconductor device comprising the steps of:

generating multi-phase clock signals by adjusting an input clock signal through a delay chain having a plurality of delay units;

decoding a thermometer code value in accordance with selection data;

outputting one of the plurality of clock signals in response to the thermometer code value, wherein the step of outputting one of the plurality of clock signals comprises the step of selectively outputting by dividedly multiplexing the thermometer code value into two stages of upper and lower bits; and restoring a pulse shape of the output clock signal into its original state and outputting it as a delay-controlled internal clock signal.

11. A semiconductor clock signal circuit, comprising:

means for generating multi-phase clock signals by adjusting an input clock signal through a delay chain having a plurality of delay units;

means for decoding a thermometer code value in accordance with selection data;

means for outputting one of the plurality of clock signals in response to the thermometer code value, wherein the means for outputting one of the plurality of clock signals comprises means for selectively outputting by dividedly multiplexing the thermometer code value into two stages of upper and lower bits; and means for restoring a pulse shape of the output clock signal into its original state and outputting it as a delay-controlled internal clock signal.

12. The method of claim 10, wherein the step of generating multi-phase clock signals further comprises regenerating a waveform of at least one of the multi-phase clock signals along a point in the delay chain.

13. The method of claim 10, wherein the step of generating the multi-phase clock signals comprises delaying the input clock signal using RC delay stages.

14. The method of claim 10, wherein the step of generating the multi-phase clock signals comprises delaying the input clock signal using path gates.

15. The circuit of claim 11, wherein the means for generating multi-phase clock signals further comprises means for regenerating a waveform of at least one of the multi-phase clock signals along a point in the delay chain.

16. The circuit of claim 11, wherein the means for generating the multi-phase clock signals comprises a plurality of RC delay stages for delaying the input clock signal.

17. The circuit of method of claim 11, wherein the means for generating the multi-phase clock signals comprises a plurality of path gates for delaying the input clock signal.

\* \* \* \* \*